US008741715B2

(12) United States Patent
Moore et al.

(10) Patent No.: US 8,741,715 B2
(45) Date of Patent: Jun. 3, 2014

(54) GATE ELECTRODES FOR MILLIMETER-WAVE OPERATION AND METHODS OF FABRICATION

(75) Inventors: Marcia Moore, Santa Barbara, CA (US); Sten Heikman, Goleta, CA (US)

(73) Assignee: Cree, Inc., Goleta, CA (US)

(*) Notice: Subject to any disclaimer, the term of this patent is extended or adjusted under 35 U.S.C. 154(b) by 0 days.

(21) Appl. No.: 12/432,478

(22) Filed: Apr. 29, 2009

(65) Prior Publication Data
US 2010/0276698 A1 Nov. 4, 2010

(51) Int. Cl.
*H01L 21/336* (2006.01)

(52) U.S. Cl.
USPC ............. 438/270; 438/172; 257/E21.45

(58) Field of Classification Search
USPC .................................. 438/172, 270
See application file for complete search history.

(56) References Cited

U.S. PATENT DOCUMENTS

| | | | |
|---|---|---|---|
| 4,214,251 A | 7/1980 | Schairer | |
| 4,824,767 A * | 4/1989 | Chambers et al. | 430/314 |
| 4,946,547 A | 8/1990 | Palmour et al. | 156/643 |
| 5,192,987 A | 3/1993 | Khan et al. | 257/183.1 |
| 5,200,022 A | 4/1993 | Kong et al. | 156/612 |
| 5,296,395 A | 3/1994 | Khan et al. | 437/40 |
| RE34,861 E | 2/1995 | Davis et al. | 437/100 |
| 5,500,381 A * | 3/1996 | Yoshida et al. | 438/172 |
| 5,563,079 A * | 10/1996 | Shin et al. | 438/571 |
| 5,712,175 A * | 1/1998 | Yoshida | 438/167 |
| 5,959,316 A | 9/1999 | Lowrey | 257/98 |
| 5,990,531 A | 11/1999 | Taskar et al. | 257/410 |
| 6,197,609 B1 | 3/2001 | Tsutsui et al. | |
| 6,316,793 B1 | 11/2001 | Sheppard et al. | 257/103 |
| 6,486,499 B1 | 11/2002 | Krames et al. | 257/81 |
| 6,642,652 B2 | 11/2003 | Collins et al. | 313/512 |
| 6,657,236 B1 | 12/2003 | Thibeault et al. | 257/98 |
| 6,828,596 B2 | 12/2004 | Steigerwald et al. | 257/99 |
| 6,869,812 B1 | 3/2005 | Liu | |
| 6,885,036 B2 | 4/2005 | Tarsa et al. | 257/99 |

(Continued)

FOREIGN PATENT DOCUMENTS

| | | |
|---|---|---|
| DE | 102007046743 | 4/2009 |
| JP | 57042179 | 3/1982 |

(Continued)

OTHER PUBLICATIONS

Grundbacher et al., "Utilization of an Electron Beam Resist Process to Examine the Effects of Asymmetric Gate Recess on the Device Characteristics of AlGaAs/InGaAs PHEMT's," IEEE, vol. 44., No. 12, Dec. 1997.*

(Continued)

*Primary Examiner* — A. Sefer
(74) *Attorney, Agent, or Firm* — Koppel, Patrick, Heybl & Philpott

(57) ABSTRACT

A transistor device having a tiered gate electrode fabricated with methods using a triple layer resist structure. The triple layer resist stack is deposited on a semiconductor structure. An exposure pattern is written onto the resist stack using an e-beam writer, for example. The exposure dose is non-uniform across the device. Portions of the three resist layers are removed with a sequential development process, resulting in tiered resist structure. A conductive material is deposited to form the gate electrode. The resulting "Air-T" gate also has a three-tiered structure. The fabrication process is well-suited for the production of gates small enough for use in millimeter wave devices.

17 Claims, 5 Drawing Sheets

(56) References Cited

U.S. PATENT DOCUMENTS

| | | | | |
|---|---|---|---|---|
| 6,888,171 | B2 | 5/2005 | Liu et al. | 257/99 |
| 6,946,309 | B2 | 9/2005 | Camras et al. | 438/26 |
| 7,141,825 | B2 | 11/2006 | Horio et al. | 257/79 |
| 7,154,125 | B2 | 12/2006 | Koide et al. | 257/95 |
| 7,348,212 | B2 | 3/2008 | Schiaffino et al. | 438/106 |
| 7,365,374 | B2 | 4/2008 | Piner et al. | 257/189 |
| 7,432,142 | B2 | 10/2008 | Saxler et al. | 438/167 |
| 7,439,166 | B1* | 10/2008 | Milosavljevic et al. | 438/577 |
| 7,608,497 | B1* | 10/2009 | Milosavljevic et al. | 438/182 |
| 7,709,282 | B2 | 5/2010 | Fukshima et al. | 438/26 |
| 7,795,623 | B2 | 9/2010 | Emerson et al. | 257/79 |
| 8,368,100 | B2 | 2/2013 | Donofrio et al. | 257/98 |
| 2002/0017648 | A1 | 2/2002 | Kasahara et al. | 257/79 |
| 2005/0147923 | A1* | 7/2005 | Sawada | 430/314 |
| 2005/0159009 | A1* | 7/2005 | Makiyama et al. | 438/712 |
| 2005/0211989 | A1 | 9/2005 | Horio et al. | 257/79 |
| 2005/0258450 | A1 | 11/2005 | Saxler | 257/192 |
| 2005/0258451 | A1 | 11/2005 | Saxler et al. | 257/192 |
| 2006/0081869 | A1 | 4/2006 | Lu et al. | 257/99 |
| 2006/0091405 | A1 | 5/2006 | Kwak | |
| 2006/0108606 | A1 | 5/2006 | Saxler et al. | 257/200 |
| 2006/0202272 | A1 | 9/2006 | Wu et al. | 257/355 |
| 2006/0273335 | A1 | 12/2006 | Asahara | |
| 2007/0041703 | A1* | 2/2007 | Wang | 385/147 |
| 2007/0063215 | A1 | 3/2007 | Kohda | 438/46 |
| 2007/0111473 | A1 | 5/2007 | Furukawa et al. | 438/455 |
| 2007/0145392 | A1 | 6/2007 | Haberern et al. | 257/79 |
| 2007/0262338 | A1 | 11/2007 | Higashi et al. | 257/99 |
| 2008/0064133 | A1 | 3/2008 | Lee et al. | 438/29 |
| 2008/0182369 | A1* | 7/2008 | Jeong et al. | 438/172 |
| 2008/0203541 | A1* | 8/2008 | Makiyama | 257/640 |
| 2008/0217635 | A1 | 9/2008 | Emerson et al. | |
| 2008/0241757 | A1* | 10/2008 | Xu et al. | 430/312 |
| 2008/0251858 | A1* | 10/2008 | Ahn et al. | 257/386 |
| 2008/0274431 | A1* | 11/2008 | Nozaki et al. | 430/319 |
| 2008/0290364 | A1 | 11/2008 | Kamiya et al. | |
| 2008/0308832 | A1 | 12/2008 | Hsieh et al. | |
| 2009/0121241 | A1 | 5/2009 | Keller et al. | 257/94 |
| 2009/0283787 | A1 | 11/2009 | Donofrio | 257/98 |
| 2010/0140636 | A1 | 6/2010 | Donofrio et al. | 257/98 |

FOREIGN PATENT DOCUMENTS

| | | | |
|---|---|---|---|
| JP | 4-284620 | * | 10/1992 |
| JP | 8111544 | | 4/1996 |
| JP | 08111544 | | 4/1996 |
| JP | 9-129532 | * | 5/1997 |
| JP | 09008403 | | 10/1997 |
| JP | 10189649 | | 7/1998 |
| JP | 11150298 | | 6/1999 |
| JP | 2000311704 | | 7/2000 |
| JP | 2001-308380 | | 11/2001 |
| JP | 2002353499 | | 12/2002 |
| JP | 2003347589 | | 12/2003 |
| JP | 2004047988 | | 2/2004 |
| JP | 2004-266240 | | 9/2004 |
| JP | 3105430 U | | 10/2004 |
| JP | 2005244152 | | 9/2005 |
| JP | 2005123489 | | 12/2005 |
| JP | 2006128727 | | 5/2006 |
| JP | 2006216933 | | 8/2006 |
| JP | 2006313888 | | 11/2006 |
| JP | 2007073965 | | 3/2007 |
| JP | 2007511065 | | 4/2007 |
| JP | 200731704 | | 11/2007 |
| JP | 2008288548 | | 11/2008 |
| WO | WO2006006555 | | 1/2006 |
| WO | WO 2007/141763 A1 | | 12/2007 |
| WO | WO2007141763 | | 12/2007 |
| WO | WO 2009/039805 A1 | | 4/2009 |

OTHER PUBLICATIONS

U.S. Publication No. US 2005/0170574, Pub. Date: Aug. 4, 2005, to Sheppard et al.
U.S. Publication No. US 2007/0164321 Al, Pub. Date: Jul. 19, 2007, to Sheppard et al.
International Search Report and Written Opinion for PCT/US2010/024980 mailed Oct. 6, 2010.
Notice of Reasons for Rejection from Japanese Patent Application No. 2009-132243, dated: Dec. 16, 2011.
Office Action from patent U.S. Appl. No. 11/904,064, dated: Apr. 22, 2011.
Response to Office Action from patent U.S. Appl. No. 11/904,064, filed: Jul. 22, 2011.
U.S. patent application Publication No. US 2003/0218183 A1, Micovic et al., Nov. 2003.
Office Action from U.S. Appl. No. 12/185,031, dated: Jun. 14, 2011.
Response to Office Action from U.S. Appl. No. 12/185,031, filed: Nov. 14, 2011.
U.S. Patent Application Publication No. US 2007/0102715, Ko et al., May 2007.
U.S. Patent Application Publication No. US 2009/0140272, Beeson et al., Jun. 2009.
Office Action from patent U.S. Appl. No. 12/012,376, dated Jul. 8, 2010.
Response to Office Action from patent U.S. Appl. No. 12/012,376, filed Sep. 28, 2010.
Office Action from U.S. Appl. No. 12/012,376, dated: Dec. 3, 2010.
Response to Office Action from U.S. Appl. No. 12/012,376, filed Jan. 26, 2011.
Office Action from U.S. Appl. No. 12/012,376, dated: Feb. 22, 2011.
Response to Office Action from U.S. Appl. No. 12/012,376, filed Mar. 22, 2011.
Notice of Allowance from U.S. Appl. No. 12/012,376, dated: May 13, 2011.
Office Action from U.S. Appl. No. 11/904,064, dated: Sep. 19, 2011.
U.S. patent application publication No. US 2008/0258270 A1, Bondoux et al., Oct. 2008.
Office Action from U.S. Appl. No. 12/463,709, dated: Dec. 15, 2011.
U.S. patent application publication No. US 2011/0163347 A1, Hasnain, Ghulam, Jul. 1011.
U.S. patent application publication No. US 2008/0290364 A1, Kamiya et al., Nov. 2008.
Decision of Rejection from Japanese Patent Application No. 2009-132243, dated Oct. 2, 2012.
Fourth Office Action from Chinese Patent Appl, No. 200880020777.7, dated Feb. 17, 2013.
Interrogation from Japanese Patent Application No. 2009-132243, dated Apr. 23, 2013.
Notice of Reasons for Rejection from Japanese Patent Application 2010-534010, dated Jun. 26, 2012.
Office Action from U.S. Appl. No. 11/904,064, dated Jul. 26, 2012.
Response to OA from U.S. Appl. No. 11/904,064, filed Jan. 28, 2013.
Office Action from U.S. Appl. No. 12/185,031, dated Jun. 12, 2012.
Response to OA from U.S. Appl. No. 12/185,031, filed Aug. 24, 2012.
Office Action from U.S. Appl. No. 11/904,064, dated Feb. 25, 2013.
Response to OA from U.S. Appl. No. 11/904,064, filed May 24, 2013.
Office Action from U.S. Appl. No. 11/904,064, dated Jun. 12, 2013.
Response to OA from U.S. Appl. No. 11/904,064, filed Aug. 20, 2013.
Office Action from U.S. Appl. No. 13/023,788, dated Mar. 12, 2013.
Response to OA from U.S. Appl. No. 13/023,788, filed Jun. 11, 2013.
Office Action from U.S. Appl. No. 11/738,171, dated Jun. 27, 2013.
Office Action from U.S. Appl. No. 13/023,788, dated Jul. 2, 2013.
Notice of Reasons for Rejection from Japanese Patent Appl. No. 2009-132243, dated Oct. 1, 2013.
Office Action from Japanese Patent Appl. No. 2012-510802, dated Oct. 8, 2013.
First Office Action from Chinese Patent Appl. No. 201080026730.9, dated Oct. 23, 2013.
Ho Won Jang et al. "Characterization of Band Bendings on Ga-Face and N-Face Gan Films Grown by Metalorganic Chemical-Vapor Deposition," Journal of Applied Physics Letters, vol. 80, No. 21, May 27, 2002, pp. 3955-3957.
O. Ambacher et al. "Two-Dimensional Electron Gases Induced by Spontaneous and Piezoelectric Polarization Charges in N- and Ga-

(56) References Cited

OTHER PUBLICATIONS

Face Algan/Gan Heterostructures," Journal of Applied Physics, vol. 85, No. 6, Mar. 15, 1999, pp. 3222-3233.

S. Ruvimov et al. "Microstructure of Ti/Al and Ti/Al/Ni/Au OHMIC Contacts for N-Gan," Applied Physics Letters 69(11), Sep. 9, 1996, pp. 1556-1558.

B. P. Luther et al. "Analysis of a Thin Aln Interfacial Layer in Ti/Al and Pd/Al OHMIC Contacts to N-Type Gan," Appl. Physics Letters 71(26), Dec. 29, 1997, pp. 3859-3861.

Joon Seop Kwak et al. "Crystal-Polarity Dependence of Ti/Al Contacts to Freestanding N-Gan Substrate," Applied Physics Letters, vol. 79, No. 20, Nov. 12, 2001, pp. 3254-3256.

B.P. Luther et al. "Study of Contact Resistivity, Mechanical Integrity, and Thermal Stability of Ti/Al and Ta/Al OHMIC Contacts to n-Type Gan," Journal of Electronic Materials, vol. 27, No. 4 1998, pp. 196-199.

Zhou, H.P. et al. "Temperature Dependence of Refractive Index in InN Thin Films Grown by Reactive Sputtering," Journal of Applied Physics, vol. 96, No. 6, Sep. 15, 2004, pp. 3199-3205.

Wu et al., "Bias-Dependent Performance of High-Power Algan/Gan HEMTS," IEDM-2001, Washington DC, Dec. 2-6, 2001,pp. 378-380.

Wu Lu, "Algan/Gan HEMTS on Sic With Over 100 Ghz Ft and Low Microwave Noise," IEEE Transactions on Electron Devices, vol. 48, No. 3, March 2001, pp. 581-585.

Wu, "30-W/MM Gan HEMTS by Field Plate Optimization," IEEE Electron Device Letters, vol. 25, No. 3, Mar. 2001, pp. 117-119.

Karmalkar et al. "Very High Voltage Algan/Gan High Electron Mobility Transistors Using a Field Plate Deposited on a Stepped Insulator," Solid State Electronics 45 (2001) pp. 1645-1652.

Wu et al. "High Al-Content Algan/Gan HEMTS on Sic Substrates With Very-High Power Performance," IEEE 1999 Digest, pp. 925-927.

Gaska, "High-Temperature Performance of Algan/Gan HFETS on Sic Substrates," IEEE Electron Device Letters, vol. 18, No. 10, Oct. 1997, pp. 492-494.

Gaska et al., "Electron Transport in Algan-Gan Heterostructures Grown on 6H-Sic Substrates," Applied Physics Letters, Vol. 72, No. 6, Feb. 1998, pp. 707-709.

Gelmont et al., "Monte Carlo Simulation of Electron Transport in Gallium Nitride," J. Applied Physics, vol. 74, No. 3, Aug. 1993, pp. 1818-1821.

Windisch et al. "Impact of Texture-Enhanced Transmission on High-Efficiency Surface-Textured Light-Emitting Diodes," Applied Physics Letters, vol. 79, No. 15, Oct. 2001, pp. 2315-2317.

Schnitzer et al. "30% External Quantum Efficiency From Surface Textured, Thin-Film Light-Emitting Diodes," Applied Physics Letters, Oct. 18, 1993, vol. 64, No. 16, pp. 2174-2176.

Windisch et al. "Light-Extraction Mechanisms in High-Efficiency Surface-Textured Light-Emitting Diodes," IEEE Journal on Selected Topics in Quantum Electronics, vol. 8, No. 2, Mar./Apr. 2002, pp. 248-255.

Streubel, et al. "High Brightness AlGaInP Light-Emitting Diodes," IEEE Journal on Selected Topics in Quantum Electronics, vol. 8, No. 2, Mar./Apr. 2002, pp. 321-332.

Nichia Corp. White Led, Part No. NSPW300BS., Apr. 7, 2006.

Nichia Corp. White Led, Part No. NSPW312BS., Apr. 7, 2006.

Rejection Decision from Chinese Patent Appl, No. 200880320777.7, dated Jul. 3. 2013.

Interrogatory from Japanese Patent Appl. No. 2010-504160, dated Jul. 16, 2013.

Preliminary Examination Report from Japanese Patent Appl. No. 2010-504160, dated Jun. 25, 2013.

Notice of Reasons for Rejection from Japanese Patent Application No, 2012-510802, dated May 21, 2013.

* cited by examiner

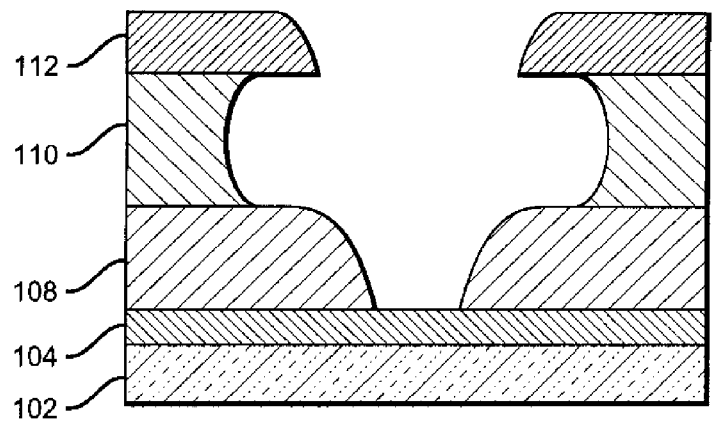
FIG. 4a
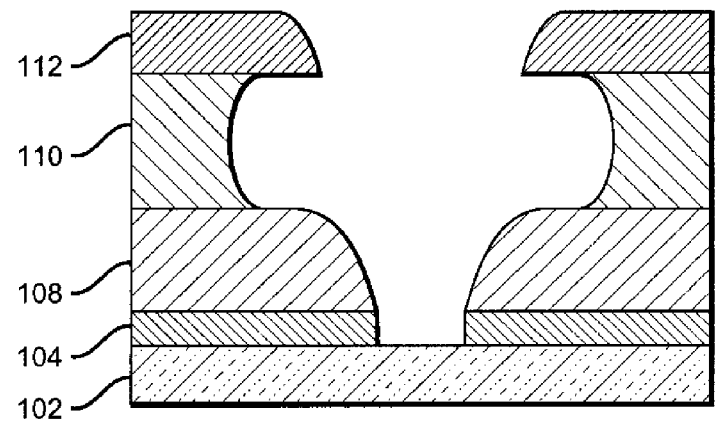
FIG. 4b
FIG. 4c
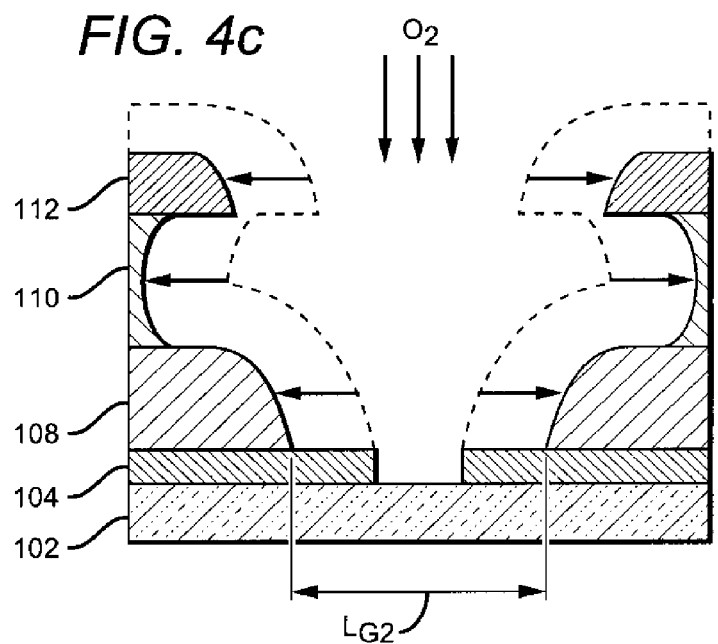

US 8,741,715 B2

GATE ELECTRODES FOR MILLIMETER-WAVE OPERATION AND METHODS OF FABRICATION

This invention was made with Government support under Office of Naval Research Contract Nos. N00014-06-C-0156, N00014-03-C-0092, and N00173-07-C-4012. The Government has certain rights in this invention.

BACKGROUND OF THE INVENTION

1. Field of the Invention

Embodiments of the invention relate generally to transistors and methods of manufacture and, more particularly, to gate structures for use in transistors and methods of manufacture.

2. Description of the Related Art

Materials such as silicon (Si) and gallium arsenide (GaAs) have found wide application in semiconductor devices for low power and, in the case of Si, low frequency applications. However, these more familiar semiconductor materials may not be well-suited for high power and/or high frequency applications, for example, due to their relatively small bandgaps (1.12 eV for Si and 1.42 for GaAs at room temperature) and relatively small breakdown voltages.

In light of the difficulties presented by Si and GaAs, interest in high power, high temperature and/or high frequency applications and devices has focused on wide bandgap semiconductor materials such as silicon carbide (2.996 eV for alpha SiC at room temperature) and the Group III nitrides (e.g., 3.36 eV for GaN at room temperature). These materials, typically, may have higher electric field breakdown strengths and higher electron saturation velocities as compared to GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies. The smaller bandgap material may have a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

HEMTs in the GaN/AlGaN system have already been demonstrated. For example, U.S. Pat. Nos. 5,192,987 and 5,296,395 describe AlGaN/GaN HEMT structures and methods of manufacture. In addition, U.S. Pat. No. 6,316,793, to Sheppard et al., which is commonly assigned with the present application, describes a HEMT device having a semi-insulating silicon carbide substrate, an AlN buffer layer on the substrate, an insulating GaN layer on the buffer layer, an AlGaN barrier layer on the GaN layer, and a passivation layer on the AlGaN active structure. Moreover, U.S. Patent Application Publication No. U.S. 2005/0170574 to Sheppard et al., which is also commonly assigned, describes a HEMT device including a protective layer and/or a low damage recess fabrication technique which may reduce damage to the semiconductor in the gate region of the transistor that can occur during an anneal of the ohmic contacts of the device.

One step in the fabrication of HEMT devices is the formation of the gate electrode. Conventional methods of gate electrode formation may include depositing a dielectric, etching through the dielectric using a mask and/or other sacrificial layer, and depositing a T-shaped gate electrode (referred to as a "T-gate") into the etched portion of the dielectric. However, in such conventional methods, gaps may be formed between the edges of the dielectric and the gate electrode, due to isotropy of the dielectric etch. This may be detrimental to device operation, as the unpassivated semiconductor surface exposed by the gap may cause current collapse and/or drift in the device. In addition, although a passivation layer may be formed in the gap after formation of the gate, the passivation properties of such a post-gate passivation layer may be inferior to that of the initial pre-gate dielectric. This may be due to the fact that the pre-gate dielectric can be formed at relatively high temperatures, which may not be feasible once the gate metallization has been deposited.

Accordingly, other methods of gate electrode formation have been developed to prevent formation of such a gap. For example, the mask and/or other sacrificial layer may be removed from the dielectric prior to formation of the gate electrode in the etched portion of the dielectric. As such, the gate electrode may completely fill the etched portion of the dielectric, and "wings" or side lobes of the gate electrode may be formed directly on the dielectric surface. Such a gate electrode is referred to as a dielectrically-supported T-gate, or a "gamma" gate.

U.S. Patent Application Publication No. 2007/0164321 to Sheppard et al., commonly assigned with the present application, discusses methods for fabricating transistors including supported gate electrodes.

SUMMARY OF THE INVENTION

A transistor according to an embodiment of the present invention comprises the following element. A semiconductor structure is provided. A protective layer is disposed on the semiconductor structure and has an opening exposing a portion of the semiconductor structure. A gate electrode comprises a contact portion, a first-tier portion, and a second-tier portion. The contact portion is disposed in the opening and electrically contacts the semiconductor structure. The first-tier portion is disposed on the contact portion and extends laterally on the protective layer on at least one side of the contact portion. The first-tier section comprises sidewalls having a generally concave shape. The second-tier portion is disposed on the first-tier portion opposite the contact portion and extends laterally beyond at least one edge of the first-tier portion.

A method of fabricating a gate electrode on a semiconductor structure according to an embodiment of the present invention comprises the following steps. A resist layer is deposited that comprises an inner layer, a middle layer, and an outer layer on the semiconductor structure. The inner layer is closest to the semiconductor structure. Selected portions of the resist layer are removed in sequence starting with the outer layer. A conductive material is deposited in the space left after the removal of selected portions.

A method for manufacturing a semiconductor device according to an embodiment of the present invention comprises the following steps. A semiconductor structure is formed. A protective layer is deposited on the semiconductor structure. A portion of the protective layer is etched to expose a portion of the semiconductor device. An inner resist layer is deposited on the protective layer and the exposed portion of the semiconductor structure. A middle resist layer is deposited on the inner resist layer. An outer resist layer is deposited on the middle resist layer. A pattern is written on the resist layers with an electron beam. The electron beam outputs a varying exposure dosage during the writing. The outer resist layer is developed to expose a portion of the middle resist layer. The middle resist layer is developed to expose a portion of the inner resist layer. The inner resist layer is developed to expose a portion of the semiconductor structure. A metal is deposited in the area left by the developing of the outer, middle, and inner resist layers.

BRIEF DESCRIPTION OF THE DRAWINGS

FIGS. 4a-c show a cross-sectional view of a portion of a transistor device during various stages of fabrication according to an embodiment of the present invention.

DETAILED DESCRIPTION OF THE INVENTION

Figure 1A:
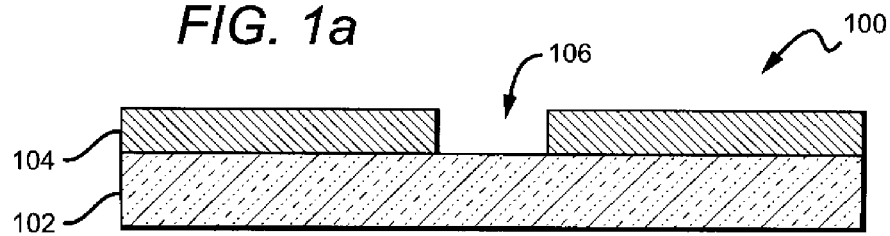
FIGS. 1a-g are cross-sectional views of a portion of a transistor device in various stages of the fabrication process according to an embodiment of the present invention.

The present invention is described more fully hereinafter with reference to the accompanying drawings, in which embodiments of the invention are shown. However, this invention should not be construed as limited to the embodiments set forth herein. Rather, these embodiments are provided so that this disclosure is thorough and complete and fully conveys the scope of the invention to those skilled in the art. In the drawings, the thickness of layers and regions are exaggerated for clarity. Like numbers refer to like elements throughout.

It is understood that when an element such as a layer, region or substrate is referred to as being "on" or extending "onto" another element, it can be directly on or extend directly onto the other element or intervening elements may be present. In contrast, when an element is referred to as being "directly on" or extending "directly onto" another element, there are no intervening elements present. It is also understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the invention unless explicitly stated otherwise.

Unless otherwise defined, all terms used in disclosing embodiments of the invention, including technical and scientific terms, have the same meaning as commonly understood by one of ordinary skill in the pertinent art and are not necessarily limited to the specific definitions known at the time of the present invention. Accordingly, these terms can include equivalent terms that are created after such time. It is further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein.

FIGS. 1a-g illustrate a portion of a transistor device 100 according to an embodiment of the invention in various stages of fabrication. The portion of the transistor 100 that is shown is centered around the region where the gate is disposed. It is understood that transistor 100 also comprises source and drain contacts one either side of the gate; however, these features are not shown in particular views of FIGS. 1a-g.

Referring to FIG. 1a, a semiconductor structure 102 is provided. Several different semiconductor material systems may be used. Some acceptable materials include the Group-III Nitrides, such as GaN, for example. The use of GaN in the formation of transistors is known in the art. In one embodiment, semiconductor structure 102 comprises a HEMT structure formed from the GaN/AlGaN material system.

A protective layer 104 is disposed on the semiconductor structure 102. In one embodiment, the protective layer 104 is on an AlGaN barrier layer of a GaN/AlGaN HEMT structure. Prior to the formation of the protective layer 104, several manufacturing steps may be taken (not shown in FIG. 1a). A high-quality blanket layer of SiN layer may be deposited on the barrier layer of a HEMT by sputtering or plasma-enhanced chemical vapor deposition (PECVD), for example. The ohmic contacts for the drain and source may be formed using a known process sequence such as: lithography, etch, deposit, and anneal. A lithography/etch process for the gate can be completed before the ohmic lithography/etch/deposit, after the etch, or after the deposit. The protective layer 104 is then formed on the surface of the semiconductor structure 102 between the ohmic pads except for an opening 106 that is appropriately sized to house a gate. A portion of the underlying semiconductor structure 102 is exposed through the opening 106. FIG. 1a shows a portion of the area between the ohmic pads that is covered with the protective layer 104 including the opening 106 where the gate will be located.

Figure 1B:
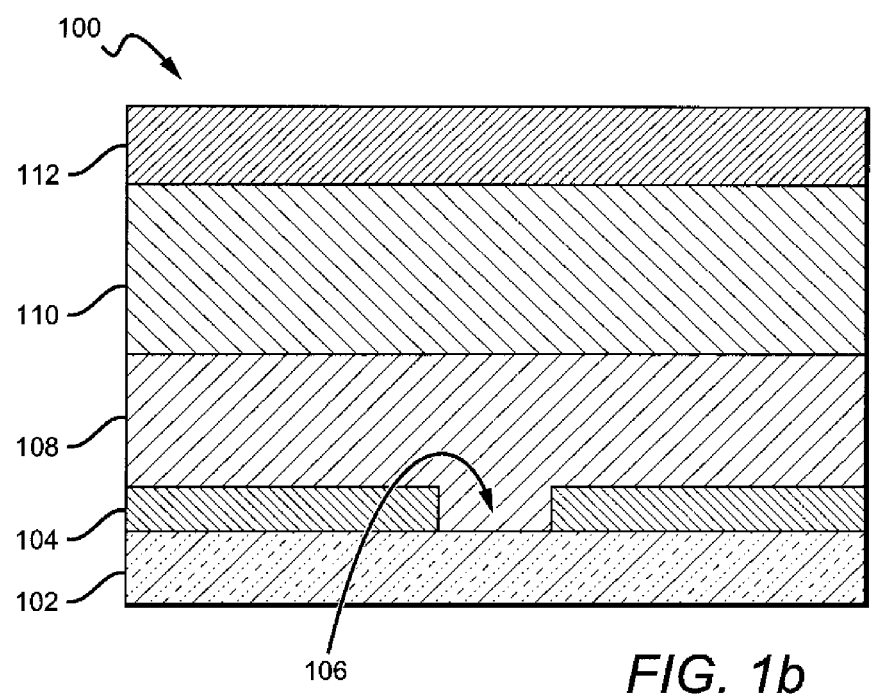

In FIG. 1b, the protective layer 104 and the exposed portion of the semiconductor structure 102 are sequentially coated with three discrete layers of resist material: an inner resist layer 108; an outer resist layer 112; and a middle resist layer 110 interposed between the two. The inner resist layer 108 is formed closest to the semiconductor structure 102. The inner resist layer 108 may comprise several materials with one acceptable material being an e-beam resist such as ZEP-520A, for example. In one embodiment, ZEP-520A is coated on to a thickness of approximately 410 nm. A middle resist layer 110 is disposed on the inner resist layer 108. The middle resist layer 110 should comprise a material that does not intermix with the inner and outer layer resist materials, can withstand the high bake temperatures associated with these resist materials, has a developer that does not develop the inner and outer resist materials, and is not affected by the inner and outer resist materials. One material that meets these criteria is polymethylglutarimide (PMGI). In one embodiment, a middle resist layer of PMGI is coated on the inner resist layer to a thickness of approximately 500-600 nm. The outer resist layer 112 is disposed on the middle resist layer 110. In one embodiment, the outer resist layer 112 comprises a material having an equal or greater sensitivity to a given developer than the inner resist layer 108. Indeed, the outer resist layer 112 may comprise the same material as the inner resist layer 108. In one embodiment, the outer resist layer 112 comprises ZEP-520A coated to a thickness of approximately 200 nm.

The inner, middle and outer resist layers 108, 110, 112 may comprise several different material combinations so long as the relationships described above are preserved. Another embodiment comprises a resist stack according to the following: inner resist layer—polymethylmethacrylate-950k (PMMA-950k); middle resist layer—PMGI; and outer resist layer—co-PMMA.

Figure 1C:
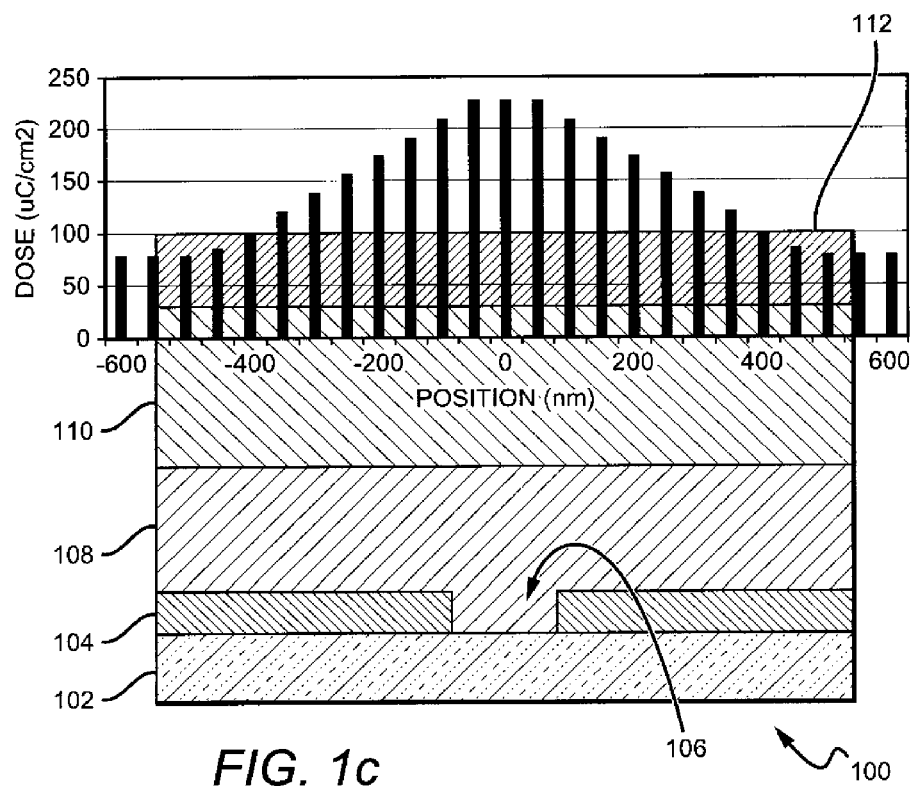

In FIG. 1c, a pattern is exposed on the resist layers 108, 110, 112. The pattern may be written using several different methods. For example, an e-beam writer may be used to write the pattern. Furthermore, the writer may be programmed to use a grayscale profile, spatially varying the dose of exposure during the write. FIG. 1c shows an exemplary non-uniform exposure scheme. The graphic overlay illustrates the exposure dose as a function of position away from the center in this particular cross-section of the transistor 100. In this embodiment, the dose is largest in the center and decreases with lateral distance away from the center. The dose is stepped down discretely, using small step sizes to create a smooth exposure profile. An advantage of this smooth exposure profile is the formation of a gently sloped resist profile after being developed, which reduces the formation of voids due to sharp resist edges when the filler material is deposited later.

As discussed above, one embodiment comprises a ZEP-520A/PMGI/ZEP-520A resist stack structure. For this particular material system, a peak dose of approximately 200-250 $\mu C/cm^2$ may be used. The dose tapers off with distance from the center to approximately 80 $\mu C/cm^2$ at the edges to create the exposure pattern. This particular exemplary exposure pattern is shown in FIG. 1c. As shown, the exposure dose is at a minimum around 500 nm from the center of the opening 106 where the gate will be located. The dose is stepped down every 50 nm moving away from the center dose. From the center to each edge, the dose may be reduced linearly or according to any monotonically decreasing function. The width of the center dose may be approximately 50 nm, although other widths may also be used. The previous model is only exemplary; it is understood that many different material systems and exposure dose profiles may be used to write a pattern onto the device.

Figure 1D:
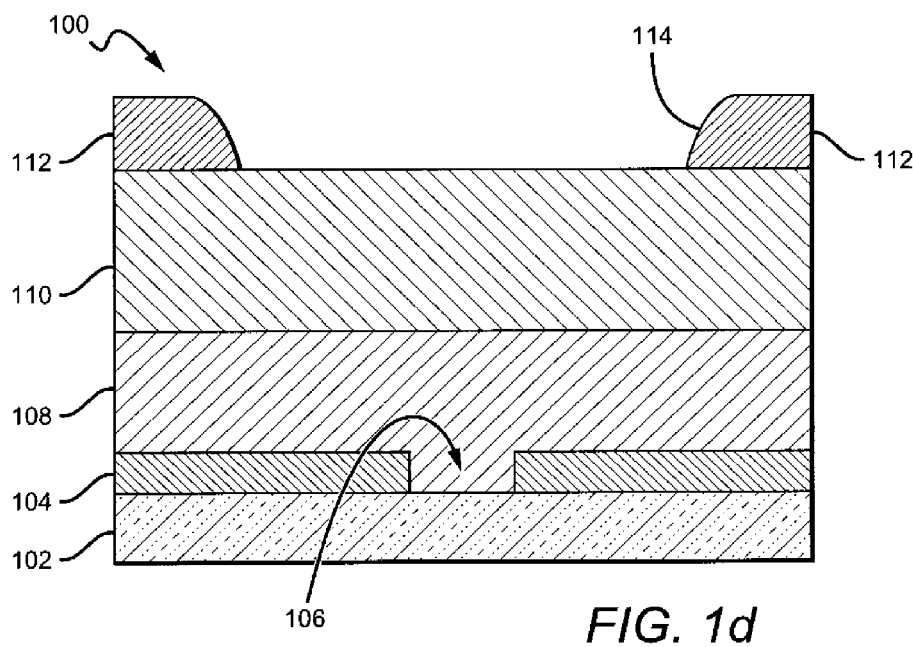

In FIG. 1d, the outer resist layer 112 is developed to create a top opening 114. The developer used should be chosen such that the middle resist layer 110 is not developed simultaneously with the outer resist layer 112. In the embodiment comprising the ZEP-520A/PMGI/ZEP-520A, a suitable first developer is a 1:3 mixture of methyl ethyl ketone and methyl isobutyl ketone (MEK:MIBK). This relatively aggressive developer works well with ZEP-520A and the exemplary doses given above. As shown in FIG. 1d, a middle portion of the outer resist layer 112 is developed to expose a portion of the underlying middle resist layer 110. The middle resist 110 layer is unaffected by the first developer.

Figure 1E:
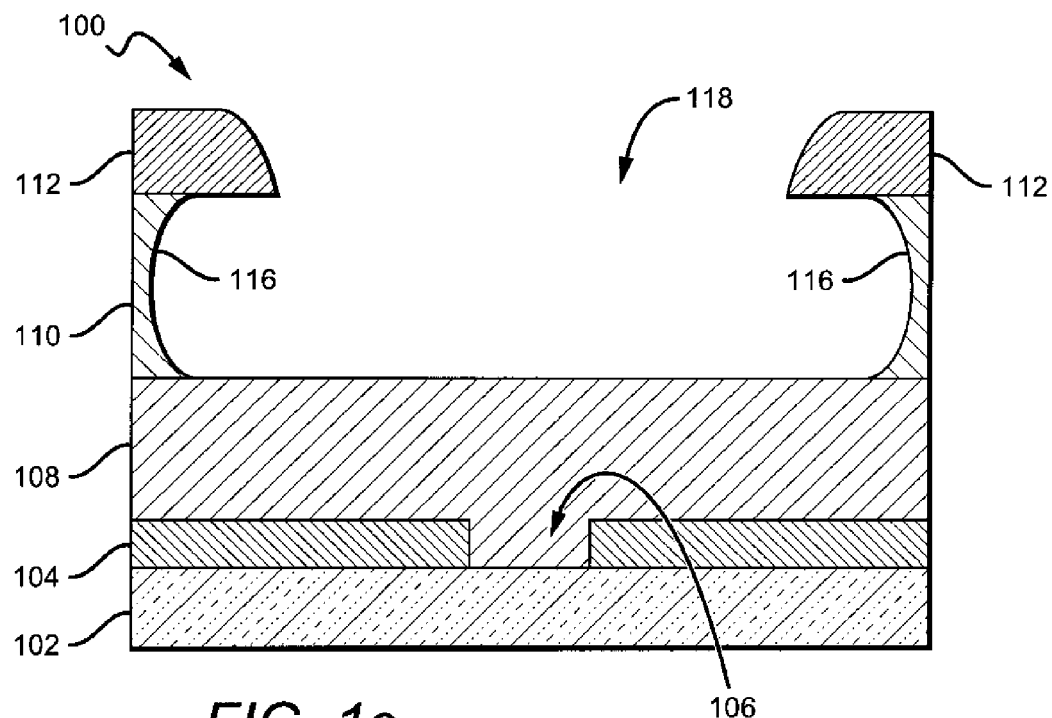

In FIG. 1e, the middle resist layer 110 is developed with a second developer that does not develop the underlying inner resist layer 108 or the remaining portion of the outer resist layer 112. For the exemplary ZEP-520A/PMGI/ZEP-520A stack, an acceptable second developer is a tetramethylammonium hydroxide (TMAH) based developer. The middle resist layer 110 is developed such that some of the resist material that is removed is laterally beyond the edge of the remaining outer resist layer 112. This leaves an undercut feature 116 on both sides of a middle opening 118. Because the second developer does not affect the outer and inner resist layers 108, 112, the size of the undercut feature 116 can be independently controlled without changing the other dimensions of the gate electrode. The second developer type may be chosen to remove the middle resist layer 110 isotropically (without regard to exposure) or anisotropically (according to the exposure). Many different developers may be used depending on the particular material system and the desired characteristics of the middle opening 118 and the undercut features 116.

Figure 1F:
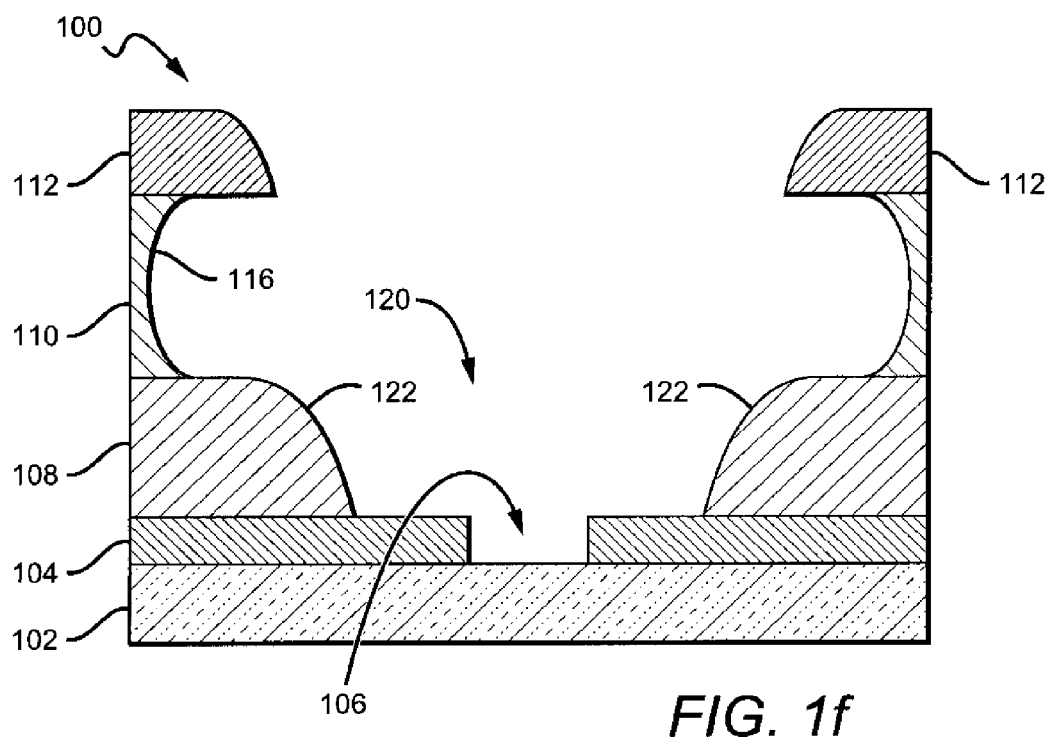

In FIG. 1f, a portion of the inner resist layer 108 is developed. It may be advantageous to use a developer that is less aggressive than the developer used in conjunction with outer resist layer 112. This prevents the remaining portion of the outer resist layer 112 from being developed. Also, a more sensitive developer will provide good linewidth control and sloped sidewalls. In the embodiment comprising the ZEP-520A/PMGI/ZEP-520A stack, a developer such as amyl acetate may be used. As the resist is developed an inner opening 120 is formed exposing the underlying semiconductor structure 102 through opening 106. Because of the exposure profile, the sidewalls 122 of the inner opening 120 angle away from the opening 106. The sidewalls 122 are also rounded.

Figure 1G:
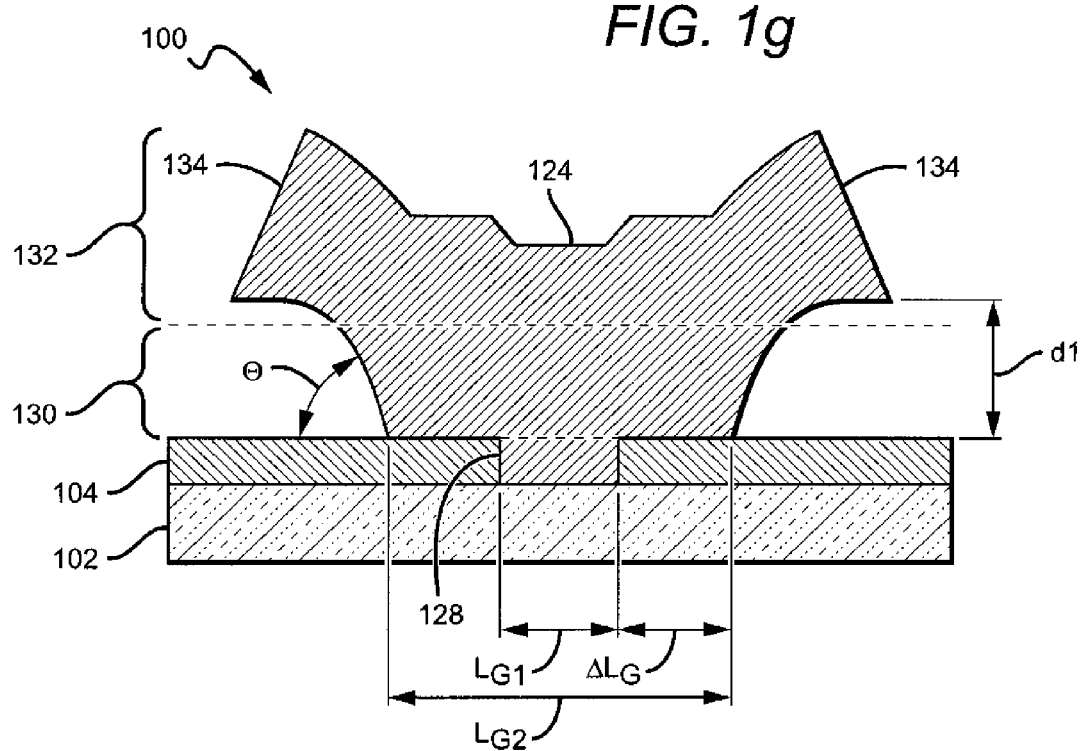

After the inner resist layer 108 is developed, the conductive material is deposited in the space formed by the development of resist layers 108, 110, 112. In one embodiment, a metal is evaporated and deposited in the space. After the conductive material is deposited, the remaining resist materials may be removed using a known lift-off technique, for example. FIG. 1g shows a gate electrode 124 after the resist materials have been removed. The gate electrode 124 comprises a contact portion 128 which is disposed in opening 106; a first tier portion 130 on the contact portion 128; and a second tier portion 132 on the first-tier portion 130.

The contact portion 128 is disposed in the opening 106. It contacts the top surface of the semiconductor structure 102 and the first-tier portion 130. In one embodiment, the top surface of the semiconductor structure 102 is a barrier layer.

The first-tier portion 130 is disposed on the contact portion 128 and extends laterally onto the protective layer 104 on one or both sides of the contact portion 128. The extended parts of the first-tier portion 130 may be different lengths, or they may have the same length. Because the shape of the gate electrode 124 generally conforms to the mold created by the removed portions of the resist layers, the first-tier portion 130 has smooth curved sidewalls having a general concave shape that angle away from the contact portion 128 as shown in FIG.1g. The curvature of the inner resist layer 108 (removed in FIG.1g) reduces the number of voids that may form due to shadowing during the deposition of the conductive material. Thus, without voids in the areas surrounding the junction of the first-tier portion and the second-tier portion, the gate electrode 124 should exhibit improved conductivity and structural stability.

The second-tier portion 132 is disposed on the first-tier portion 130. The second-tier portion 132 comprises lateral extensions 134 that extend past the edge of the first-tier portion on one or both sides.

The gate electrode 124 has what may be described as a combination of a conventional T-shaped gate and a gamma-shaped gate that may be referred to as an "Air-T" gate. Some of the advantages of this shape are described in detail in commonly assigned U.S. Pat. App. Pub. No. US 2007/0164321 to Sheppard et al., which is incorporated by reference herein in its entirety. The Air-T gate shape is advantageous for several reasons. For example, the gate-to-drain capacitance ($C_{gd}$) and the gate-to-source ($C_{gs}$) capacitance can be reduced (thereby increasing gain) by decreasing the length ($L_{G2}$) of the first-tier portion 130. Thus, the Air-T structure allows for increased gain without an unacceptable increase in gate resistance which is determined by the size of the gate cross-section. The Air-T gate structure is particularly well-suited for millimeter-wave devices, including GaN HEMTs, where high gain is critical for amplifier applications.

The fabrication process discuss herein allows for the formation of Air-T gate structures that are small enough to operate at millimeter-wave frequencies. The sidewalls of the first-tier portion 130 are generally concave and angle away from the center of the gate electrode 124. The sidewalls should have an initial slope of less than 90° ($\theta<90°$). Thus, the sidewalls of the inner resist need to have a sloped surface on which the conductive material may be deposited. The slope on the sidewalls of the inner resist allows the conductive material to be deposited more uniformly and smoothly along the interface between the first-tier portion 130 and the second-tier portion 132, resulting in fewer voids and increased conductivity and structural stability.

Figure 2:
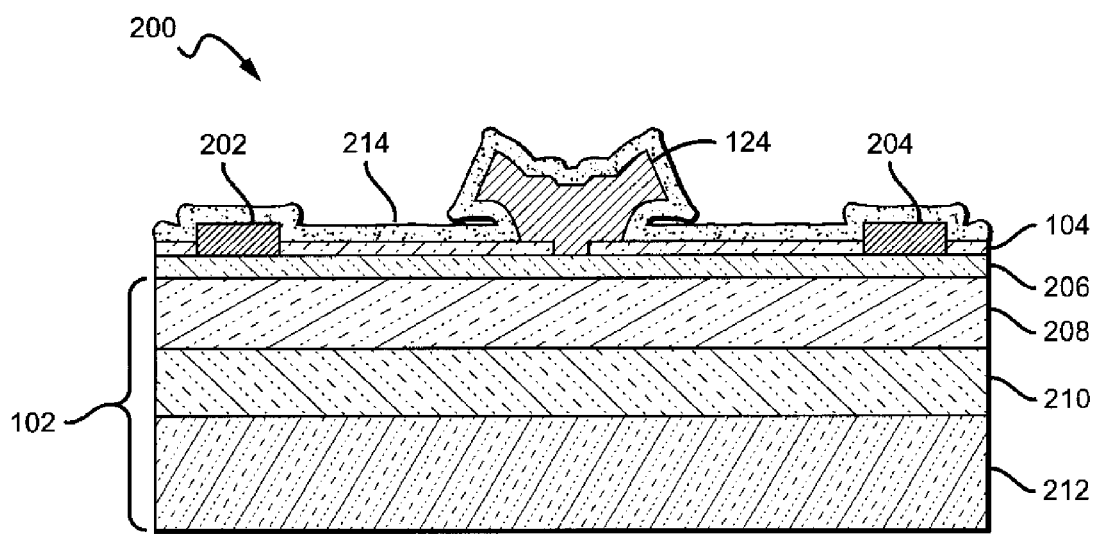
FIG. 2 is a cross-sectional view of a transistor device according to an embodiment of the present invention.

FIG. 2 illustrates a transistor device 200 according to an embodiment of the present invention. In this particular embodiment, the transistor 200 is a HEMT device. The transistor 200 comprises the gate electrode 124 flanked on either side by a source 202 and a drain 204. The gate 124, source 202, and drain 204 all contact the top surface of the underlying semiconductor structure 102. In this embodiment, the semiconductor structure 102 includes a barrier layer 206, a channel layer 208, a nucleation layer 210, and a substrate 212. A passivation layer 214 covers the gate electrode 124, the source 202, the drain 204, and the protective layer 104.

Figure 3:
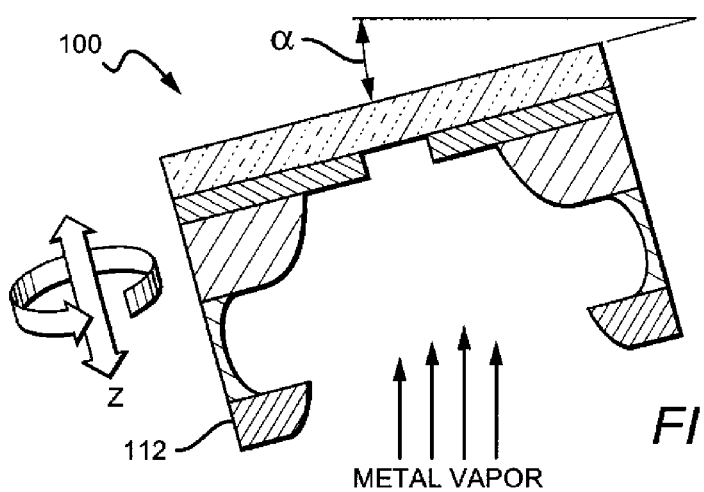
FIG. 3 is a cross-sectional view of a portion of a transistor device according to an embodiment of the present invention. A metal vapor is shown coating the device which is tilted at an angle.

FIG. 3 illustrates one embodiment of a transistor device 100 during a step in the fabrication process. At this point in the process, the resist profile has been developed, and the device is ready for metallization. In this particular embodiment, metallization is done with a metal evaporation method. The transistor device 100 may exposed to the evaporated metal while the orientation of the transistor device is varied relative to the incident metal evaporation. For example, the transistor device 100 may be mounted in a reaction chamber to a susceptor which is then rotated, tilted, and/or translated to vary the angle of incidence of the evaporated metal onto the device.

In FIG. 3 one example of varying the orientation of the transistor device 100 during a metal evaporation process is shown. The device 100 is tilted to angle α. The tilt angle α should be large enough to reduce the formation of voids as the metal deposits on the surfaces. However, if the tilt angle α is too large the overhang of the outer resist layer 112 will shadow the inner surfaces and reduce deposition. Embodiments of the invention can be fabricated using various tilt angle ranges. For example, some embodiments may have a tilt angle of 10° or greater. Other embodiments may have tilt angles of 30° or less. Some other acceptable ranges of tilt angles are angles between 10° and 30° and angles between 15° and 25°. In one embodiment a tilt angle of approximately 20° is used. The tilt angle may be varied during the deposition. The device 100 may be rotated, for example, around a central longitudinal axis (z-axis, as shown in FIG. 3) such that the all the inner surfaces of the device are evenly exposed to the metal vapor. Likewise, the device 100 may be translated during the deposition. Thus, the device may be rotated, tilted, translated, or any combination thereof to achieve a particular deposition profile.

In an alternate fabrication method, the gate electrode may be formed according to a slightly different method. FIG. 4a-c shows a triple-layer resist profile similar to the one shown in FIG. 1f. However, in this embodiment the opening for the contact portion of the gate electrode was not formed prior to the development of the resist layers. As shown in FIG. 4a, the triple-layer resist profile is formed first. Then, as shown in FIG. 4b, a gate etch is performed, removing a portion of the protective layer 104 and exposing the underlying semiconductor structure 102. In FIG. 4c, the resist profile is exposed to an $O_2$ plasma (ash) which widens the openings. The plasma etch is performed until the opening corresponds to a desired first-tier portion width ($L_{G2}$). Using this alternate method, only one lithography step is required to define gate metallization and the gate dielectric etch.

We claim:

1. A method of fabricating a gate electrode on a semiconductor structure, comprising:

depositing a resist layer that comprises an inner layer, a middle layer, and an outer layer on said semiconductor structure, said inner layer being the closest of any resist layers to said semiconductor structure and comprising a resist material different from the material of said middle layer, and said outer layer comprising a resist material different from the material of said middle layer;

removing selected portions of said resist layer in sequence starting with said outer layer, wherein a portion of said inner layer is removed such that a remaining portion of said inner layer defines sidewalls generally curving inward as they approach said semiconductor structure; and depositing a conductive material in a space left after said removal of selected portions.

2. The method of claim 1, said inner and outer layers comprising electron beam resist materials.

3. The method of claim 1, said middle layer material associated with a developer that does not develop said outer and inner layers.

4. The method of claim 1, further comprising, after depositing said resist layer, exposing a pattern on said resist layer.

5. The method of claim 4, wherein an electron beam is used to expose said pattern.

6. The method of claim 5, wherein the dose of exposure from said electron beam is non-uniform over said resist layer.

7. The method of claim 4, further comprising developing at least a portion of said outer layer such that at least a portion of said middle layer is exposed.

8. The method of claim 7, further comprising developing at least a portion of said middle layer such that a portion of said inner layer is exposed.

9. The method of claim 8, wherein a portion of said middle layer is removed that is laterally beyond the edge of the remaining portion of said outer layer, forming an undercut feature.

10. The method of claim 9, further comprising developing at least a portion of said inner layer such that at least a portion of said semiconductor structure is exposed, such that the remaining portion of said inner layer defines said generally curved sidewalls.

11. The method of claim 5, wherein during said exposure, said electron beam has a highest exposure dosage in the center of said resist layer and an exposure dosage that decreases with distance moving away from the center on both sides.

12. The method of claim 1, wherein said conductive material is deposited using an evaporation process and the orientation of said resist layer is varied during deposition.

13. The method of claim 1, wherein said inner and outer layers comprise ZEP-520A and said middle layer comprises polymethylglutarimide (PMGI).

14. The method of claim 1, wherein said inner layer comprises polymethylmethacrylate-950k (PMMA-950k), said middle layer comprises PMGI, and said outer layer comprises co-PMMA.

15. The method of claim 1, wherein said inner layer is deposited to be approximately 200-800 nm thick, said middle layer is deposited to be approximately 500-600 nm thick, and said outer layer is deposited to be approximately 200 nm thick.

16. The method of claim 1, wherein said sidewalls are generally convex and angle away from the center of said semiconductor structure.

17. A method of fabricating a gate electrode on a semiconductor structure, comprising:

depositing a resist layer that comprises an inner layer, a middle layer, and an outer layer on said semiconductor structure, said inner layer being the closest of any resist layers to said semiconductor structure and comprising a resist material different from the material of said middle layer, and said outer layer comprising a resist material different from the material of said middle layer;

removing selected portions of said resist layer in sequence starting with said outer layer, wherein a portion of said inner layer is removed such that a remaining portion of said inner layer defines sidewalls generally curving inward as they approach said semiconductor structure;

depositing a conductive material in a space left after said removal of selected portions;

after depositing said resist layer, exposing a pattern on said resist layer;

developing at least a portion of said outer layer such that at least a portion of said middle layer is exposed;

developing at least a portion of said middle layer such that a portion of said inner layer is exposed;

wherein a portion of said middle layer is removed that is laterally beyond the edge of the remaining portion of said outer layer, forming an undercut feature; and developing at least a portion of said inner layer such that at least a portion of said semiconductor structure is exposed, such that the remaining portion of said inner layer defines said generally curved sidewalls;

wherein said developing of said outer layer is done with a mix of methyl ethyl ketone and methyl isobutyl ketone (MEK:MIBK), said developing of said middle layer is done with a tetramethylammonium hydroxide (TMAH) based developer, and said developing of said inner layer is done with amyl acetate.

* * * * *